(12) United States Patent
Roth et al.

(10) Patent No.: US 10,224,237 B2
(45) Date of Patent: Mar. 5, 2019

(54) SEMICONDUCTOR DEVICES AND METHODS FOR FORMING A SEMICONDUCTOR DEVICE

(71) Applicant: Infineon Technologies AG, Neubiberg (DE)

(72) Inventors: Roman Roth, Sattendorf (AT); Frank Umbach, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/602,451

(22) Filed: May 23, 2017

(65) Prior Publication Data

US 2017/0345711 A1  Nov. 30, 2017

(30) Foreign Application Priority Data

May 25, 2016 (DE) .................. 10 2016 109 713

(51) Int. Cl.
*H01L 21/768* (2006.01)
*H01L 23/522* (2006.01)
*H01L 23/528* (2006.01)
*H01L 23/00* (2006.01)

(52) U.S. Cl.
CPC .. *H01L 21/76825* (2013.01); *H01L 21/76802* (2013.01); *H01L 21/76843* (2013.01); *H01L 21/76877* (2013.01); *H01L 23/528* (2013.01); *H01L 23/5226* (2013.01); *H01L 24/43* (2013.01); *H01L 24/45* (2013.01)

(58) Field of Classification Search
CPC ......... H01L 21/76802; H01L 21/76843; H01L 21/76877
See application file for complete search history.

(56) References Cited

U.S. PATENT DOCUMENTS

| | | | |
|---|---|---|---|
| 5,084,752 A | 1/1992 | Satoh et al. | |
| 7,935,627 B1 | 5/2011 | Shor et al. | |
| 9,536,780 B1* | 1/2017 | Yang | ................ H01L 21/76834 |
| 2003/0132991 A1* | 7/2003 | Higuchi | ............... B41J 2/14233 |
| | | | 347/70 |
| 2010/0301488 A1* | 12/2010 | Oda | .................... H01L 23/5329 |
| | | | 257/773 |

FOREIGN PATENT DOCUMENTS

| | | |
|---|---|---|
| DE | 19612838 A1 | 1/1997 |
| DE | 102004025658 A1 | 12/2005 |

* cited by examiner

*Primary Examiner* — Trang Q Tran
(74) *Attorney, Agent, or Firm* — Murphy, Bilak & Homiller, PLLC

(57) ABSTRACT

A method for forming a semiconductor device includes forming an insulating material layer above a semiconductor substrate and modifying at least a portion of a surface of the insulating material layer after forming the insulating material layer. Further, the method includes forming an electrical conductive structure on at least the portion of the surface of the insulating material layer after modifying at least the portion of the surface of the insulating material layer.

16 Claims, 6 Drawing Sheets

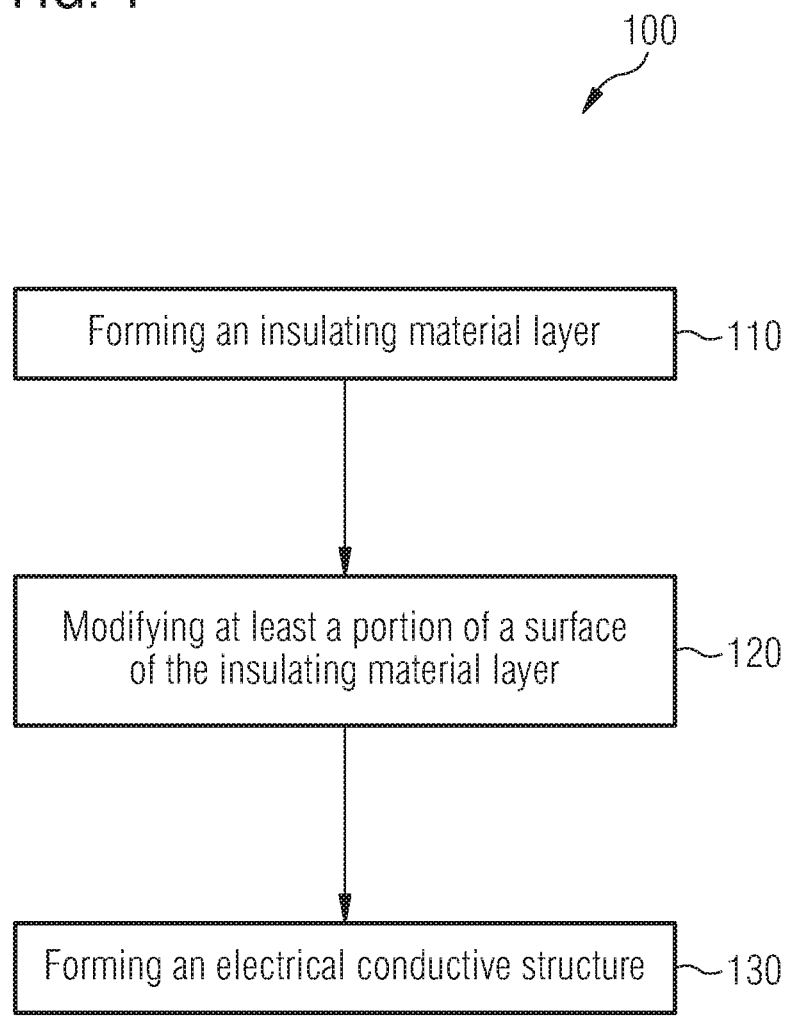

SEMICONDUCTOR DEVICES AND METHODS FOR FORMING A SEMICONDUCTOR DEVICE

TECHNICAL FIELD

Embodiments relate to concepts for bonding semiconductor dies, and in particular to methods for forming a semiconductor device and semiconductor devices

BACKGROUND

For example, wires of aluminum are used for contacting by means of Al wedge bonding for semiconductor chips in power electronics. This wire material defines the load cycling capability of the products, amongst others. For example, causes for a failure in case of temperature cycling loads are the bond wire lift-off from the chip metallization (so-called lift-off) and the rupture/cracking of the bond wire at the transition from bond foot to bond loop (so-called heel cracks).

SUMMARY

There may be a demand to provide an improved concept for semiconductor devices, which may allow increasing the reliability and/or the load cycling capability and/or the bond yield of semiconductor devices.

Some embodiments relate to a method for forming a semiconductor device. The method comprises forming an insulating material layer above a semiconductor substrate and modifying at least a portion of a surface of the insulating material layer after forming the insulating material layer. Further, the method comprises forming an electrical conductive structure on at least a portion of the surface of the insulating material layer after modifying at least the portion of the surface of the insulating material layer.

Some embodiments relate to a semiconductor device comprising an insulating material layer located above a semiconductor substrate. The insulating material layer comprises at least one contact hole. Further, the semiconductor device comprises a modified portion of the insulating material layer extends laterally from the contact hole to a lateral distance from the contact hole of more than 300 nm and vertically from the surface of the insulating material layer to a depth of more than 10 nm. The modified portion comprises a concentration of noble gas atoms of more than $1*10^{15}$ $cm^{-3}$. Additionally, the semiconductor device comprises an electrical conductive structure arranged adjacent to the modified portion of the insulating material layer and a wire bonded onto the electrical conductive structure.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 1 shows a flow chart of a method for forming a semiconductor device.

DETAILED DESCRIPTION

Figure 2A:
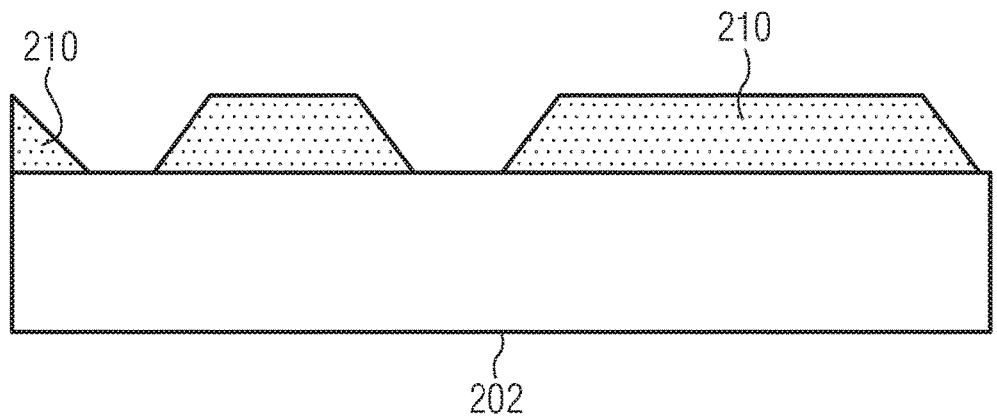
FIGS. 2a-2f show schematic cross sections of a semiconductor device at different stages of manufacturing.

Various example embodiments will now be described more fully with reference to the accompanying drawings in which some example embodiments are illustrated. In the figures, the thicknesses of lines, layers and/or regions may be exaggerated for clarity.

Accordingly, while example embodiments are capable of various modifications and alternative forms, embodiments thereof are shown by way of example in the figures and will herein be described in detail. It should be understood, however, that there is no intent to limit example embodiments to the particular forms disclosed, but on the contrary, example embodiments are to cover all modifications, equivalents, and alternatives falling within the scope of the disclosure. Like numbers refer to like or similar elements throughout the description of the figures.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Unless otherwise defined, all terms (including technical and scientific terms) used herein have the same meaning as commonly understood by one of ordinary skill in the art to which example embodiments belong. It will be further understood that terms, e.g., those defined in commonly used dictionaries, should be interpreted as having a meaning that is consistent with their meaning in the context of the relevant art. However, should the present disclosure give a specific meaning to a term deviating from a meaning commonly understood by one of ordinary skill, this meaning is to be taken into account in the specific context this definition is given herein.

FIG. 1 shows a flow chart of a method for forming a semiconductor device according to an embodiment. The method 100 comprises forming 110 an insulating material layer directly or indirectly on a semiconductor substrate and modifying 120 at least a portion of a surface of the insulating material layer after forming 110 the insulating material layer. Further, the method 100 comprises forming 130 an electrical conductive structure on at least a portion (e.g. the whole modified portion or less than the whole modified portion) of the surface of the insulating material layer after the modification 120 of at least the portion of the surface of the insulating material layer. Optionally, the method 100 may further comprise bonding a wire on the electrical conductive structure.

By modifying the surface of the insulating material layer, the adhesion or adhesive strength between the insulating material layer and the electrical conductive structure (e.g. metallization) may be increased. For example, the risk of a lift off of the electrical conductive structure from the insulating material layer during bonding and/or during load cycling may be reduced. In this way, the reliability and/or the load cycling capability of semiconductor devices and/or the manufacturing yield may be increased.

The insulating material layer may be formed 110 (e.g. deposited or grown) directly on the surface of the semiconductor substrate or on another layer (e.g. lateral wiring layer) located at a front side (main side) of the semiconductor substrate. The insulating material layer may be a last insulation layer or passivation layer of the layer stack formed on the semiconductor substrate before forming 130 the electrically conductive structure and/or bonding 150 the wire onto the electrical conductive structure. The insulating material layer (e.g. passivation layer) may be a silicon oxide based layer (e.g. silicon dioxide SiO2, silicon oxide doped with phosphorous, boron and/or arsenic), a silicon nitride based layer (e.g. silicon nitride Si3N4) or an aluminum oxide based layer (e.g. aluminum oxide Al2O3) or a mixture of two or more of these materials. For example, the insulating material layer may comprises a thickness (e.g. maximal or average vertical dimension) of more than 100 nm (or more than 200 nm, more than 500 nm or more than 1 μm) and/or less than 10 μm (or less than 7 μm or less than 5 μm). The insulating material layer may comprise at least one contact hole (vertical hole through the insulating material layer) to enable a vertical electrical connection to the semiconductor substrate and/or an electrical conductive wiring structure below the insulating material layer. For example, the method 100 may further comprise structuring the insulating material layer to form at least one contact hole through the insulating material layer (e.g. before modifying the at least one portion of the surface of the insulating material layer).

At least a portion of the surface (or the whole surface) of the insulating material layer may be modified 120 (in comparison to a surface condition directly after forming the insulating material layer) to improve the adhesion or adhesive strength to the afterwards formed electrical conductive structure. It may be sufficient to modify 120 a portion of the surface of the insulating material layer, which is later covered by the electrical conductive structure. Alternatively, the whole surface of the insulating material layer may be modified 120 to keep efforts low (e.g. to avoid an additional mask). The modification 120 may be done in various ways. For example, at least the portion of the surface of the insulating material layer may be irradiated with ions and/or a plurality of trenches is formed into the insulating material layer at least at the portion of the surface to be modified.

For example, the surface of the insulating material layer may be irradiated or implanted damage implantation) by ions to modify 120 the surface of the insulating material layer and/or a portion of the insulating material layer located at the surface of the insulating material layer. For example, the whole surface of the insulating material layer may be implanted or a portion of the surface (e.g. high voltage HV edge or edge termination region) may be masked by a resist technique (e.g. or an implant may only be performed in the region of the bond wires (e.g. below bond pads), which may help for bonding). In this way, a number of dangling bonds or open bonds at the surface of the insulating material layer may be increased, a roughness of the surface may be increased and/or the material structure at a surface region of the insulating material layer may be modified. For example, the adhesion between the insulating material layer and the electrical conductive structure may be increased due to an increased number of dangling bonds at the surface, which may establish a bond to the electrical conductive structure. A low implantation energy for irradiating the surface of the insulating material layer may be sufficient to modify 120 the surface of the insulating material layer. For example, at least the portion of the surface of the insulating material layer may be irradiated by ions comprising an energy of more than 1 keV (or more than 10 keV, more than 20 keV or more than 50 keV) and/or less than 200 keV (or less than 100 keV or less than 80 keV). In this way, a penetration of the ions into lower layers and/or the semiconductor substrate may be kept low and/or a modification of the surface may be obtained already at low doses. For example, at least the portion of the surface of the insulating material layer may be irradiated with an ion dose of more than $1*10^{12}$ cm$^{-2}$ (or more than $1*10^{13}$ cm$^{-2}$ or more than $1*10^{14}$ cm$^{-2}$) and/or less than $1*10^{16}$ cm$^{-2}$ (or less than $1*10^{15}$ cm$^{-2}$ or less than $5*10^{14}$ cm$^{-2}$). For example, the ions used for the modification 120 of the surface of the insulating material layer may be noble gas ions helium He, neon Ne, argon Ar, xenon Xe, krypton Kr), dopant ions (e.g. phosphorous P, boron B, arsenic As, nitrogen N), dioxygen O2 ions or silicon Si ions.

Alternatively or additionally, at least the portion of the surface of the insulating material layer may be modified by forming a plurality of trenches into the insulating material layer. For example, the trenches may be formed by forming a structured mask layer on the insulating material layer and etching trenches at portions of the insulating material layer uncovered by the structured mask layer. The trenches may increase the surface area at least within the modified portion of the surface of the insulating material layer. By increasing the surface area the adhesion or adhesive strength between the insulating material layer and the electrical conductive structure may be increased. For example, the trenches of the plurality of trenches may comprise a (average or maximal) width of more than 30 nm (or more than 50 nm or more than 100 nm) and less than 5 μm (or less than 3 μor less than 1 μm). For example, the trenches of the plurality of trenches may comprise a depth of more than 5 nm (more than 20 nm or more than 100 nm) and less than 2 μm (or less than 1 μm or less than 500 nm). For example, a lateral distance between edges of neighboring trenches may be more than 10% of an average width or average depth of the trenches and less than twice the average width or average depth of the trenches. The trenches may be strip-shaped trenches, circular-shaped trenches, hexagonal-shaped trenches, square-shaped trenches or may comprise another geometry.

An electrical conductive structure is formed 130 (e.g. deposited or grown) directly on at least a modified portion (e.g. the whole modified portion or less than the whole modified portion) of the surface of the insulating material layer. Afterwards, the electrical conductive structure may be structured so that portions of the electrical conductive structure are located on modified portions of the insulating material layer only, for example. The electrical conductive structure may comprise a single layer or may comprise a layer stack. For example, the electrical conductive structure is formed 130 on the whole surface of the insulating material layer. Afterwards, the electrical conductive structure may be removed from one or more portions of the surface of the insulating material layer and may remain on at least a modified portion of the surface of the insulating material layer.

For example, the electrical conductive structure may be a lateral wiring structure located in a lateral wiring layer of a layer stack located on the semiconductor substrate or may implement a contact interface (e.g. pad) for connecting (e.g. by wire bonding, sintering, pressure contacting, soldering or welding) the semiconductor substrate to an external electrical device. For example, the electrical conductive structure may comprise a metal layer formed directly on the insulating material layer or a barrier layer formed directly on at least a modified portion e.g., the whole modified portion or less than the whole modified portion) of the surface of the insulating material layer and a metal layer formed directly on the barrier layer. Afterwards, the metal layer or the barrier layer and the metal layer may be structured so that portions of the metal layer or the barrier layer and the metal layer are located on modified portions of the insulating material layer only, for example. For example, a barrier layer and/or a metal layer may be located laterally maximally at modified portion (and not at modified portions) after the metal and/or barrier processes (e.g. after structuring the metal layer and/or the barrier layer). This may be possible already at the deposition too (e.g. by using a lift-off process). For example, the barrier layer (or contact layer) may comprise titanium Ti, tungsten W, titanium tungsten TiW, tantalum Ta, tantalum nitride TaN, titanium nitride TiN, titanium tungsten nitride TAN N, chromium Cr, titanium silicide TiSi, tantalum silicide TaSi and/or nickel silicide NiSi and/or combinations of two or more of these materials. For example, the barrier layer may comprise a single layer comprising a specific material (e.g. titanium) or material composition (e.g. titanium nitride) or may comprise two or more sub-layers comprising different material compositions (e.g. titanium sub layer and titanium nitride sub-layer). The barrier layer may comprise a thickness of less than 10 µm (or less than 1 µm, less than 500 nm, less than 100 nm, less than 50 nm or less than 20 nm). The barrier layer may suppress a diffusion of material of the metal layer into a layer below (closer to the semiconductor substrate) the barrier layer. The metal layer may comprise aluminum Al, copper Cu, aluminum silicide AlSi, aluminum silicon copper AlSiCu, nickel Ni, nickel phosphorous NiP, nickel molybdenum phosphorous NiMoP, palladium Pa, gold Au and/or silver Ag and/or an alloy of two or more of these materials or a combination of two or more of these materials. The metal layer (e.g. metallization) may comprise a thickness of more than 400 nm (or more than 500, more than 1 µm or more than 5 µm) and less than 80 µm (or less than 60 µm or less than 40 µm). For example, the metal layer may implement a pad metallization to provide a surface for bonding a wire onto the pad.

A wire may be bonded (e.g. wedge bonded or ball bonded.) onto a surface of the electrical conductive structure. For example, the wire may comprise copper, aluminum and/or gold (e.g. may be a copper wire, an aluminum wire, a manganese doped aluminum wire or a gold wire). For example, the wire may be a copper wire and may comprise more than 50% copper (or more than 80% or more than 95%). For example, the wire may comprise a diameter of more than 50 µm (or more than 200 µm, more than 300 µm, e.g. 400 µm, or more than 400 µm).

For example, more than one electrical conductive structure (e.g. electrically insulated from each other) may be formed on the insulating material layer and one or more wires may be bonded to each of the electrical conductive structures e.g. pads).

Additionally, at least one contact hole may be formed through the insulating material layer before modifying 120 at least the portion of the surface of the insulating material layer. For example, a structured mask layer may be formed on the insulating material layer and uncovered portions of the insulating material layer may be etched. After forming the at least one contact hole, the electrical conductive structure may be formed 130 and may fill the at least one contact hole to implement an electrical conductive connection to a doping region of the semiconductor substrate and/or a wiring structure located in a lateral wiring layer (e.g. metal layer) below the insulating material layer.

For example, the at least one modified portion of the surface of the insulating material layer may extend laterally from the at least one contact hole to a distance from the contact hole of more than 300 nm (or more than 500 nm, more than 1 µm, more than 5 µm, more than 10 µm, more than 20 µm or more than 50 µm) or may extend laterally at least over a surface area of the insulating material structure covered by the electrical conductive structure.

The semiconductor substrate of the semiconductor device may be a silicon substrate. Alternatively, the semiconductor substrate may be a wide band gap semiconductor substrate having a band gap larger than the band gap of silicon (1.1 eV). For example, the semiconductor substrate may be a silicon carbide (SiC)-based semiconductor substrate, a silicon germanium (Site) based semiconductor substrate, or gallium arsenide (GaAs)-based semiconductor substrate, or a gallium nitride (GaN)-based semiconductor substrate. The semiconductor substrate may be a semiconductor wafer or a semiconductor die. For example, a plurality of semiconductor devices may be formed on a semiconductor wafer and may be separated from each other before bonding wires to the electrical conductive structures of the semiconductor devices.

For example, the vertical direction and a vertical dimension or thicknesses of layers may be measured orthogonal to a front side surface of the semiconductor substrate 102 and a lateral direction and lateral dimensions may be measured in parallel to the front side surface of the semiconductor substrate 102.

A lateral wiring layer (e.g. metal layer of a layer stack of a semiconductor device) may be a layer for implementing lateral electrical connections between vertical electrical connections (vias) connecting lateral wiring layers. A vertical wiring layer (e.g. via layer of a layer stack of a semiconductor device) may be a layer for implementing vertical electrical connections (vias) between lateral wiring layers. For example, the insulating material layer comprising the modified portion may be a vertical wiring layer used for implementing vertical electrical connections.

FIGS. 2a-2f show schematic cross sections of a semiconductor device at different stages of manufacturing according to an embodiment. FIG. 2a shows an insulating material layer 210 formed directly on a semiconductor substrate 202. The insulating material layer 210 comprises a plurality of contact holes reaching vertically through the insulating material layer 210.

Figure 2B:
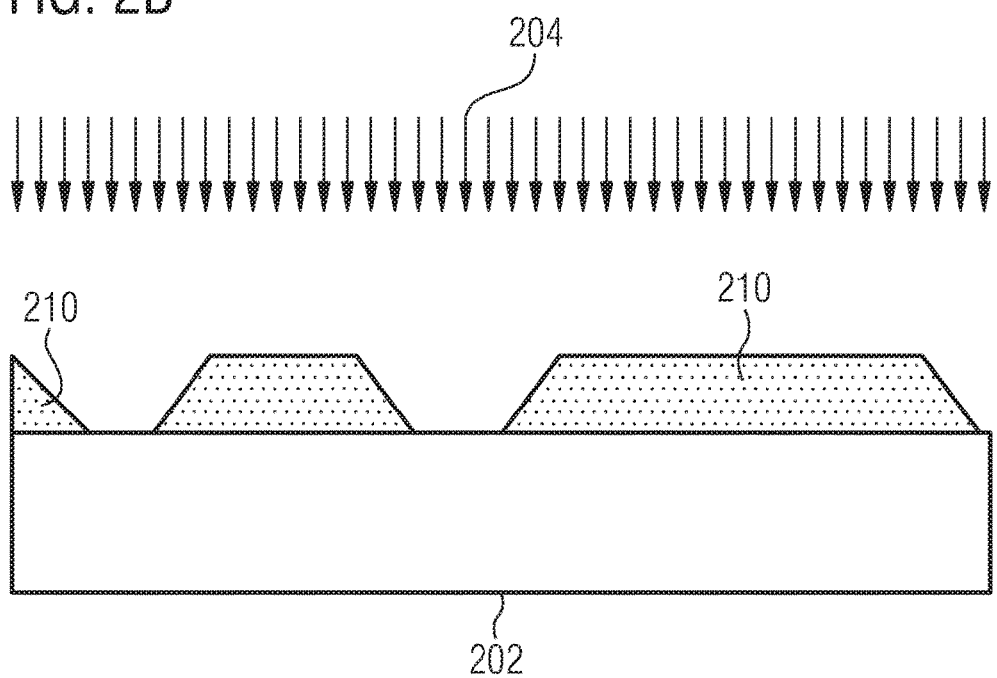
Figure 2C:
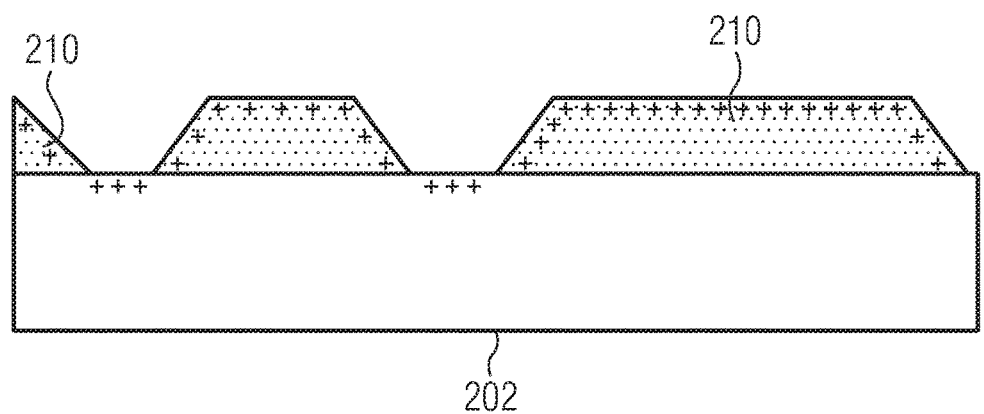

The surface of the insulating material layer 210 is irradiated by ions 204 as shown in FIG. 2b. The ions 204 are implanted in a surface portion of the insulating material layer 210 to modify the surface and the surface portion of the insulating material layer 210 as shown in FIG. 2c.

Figure 2D:
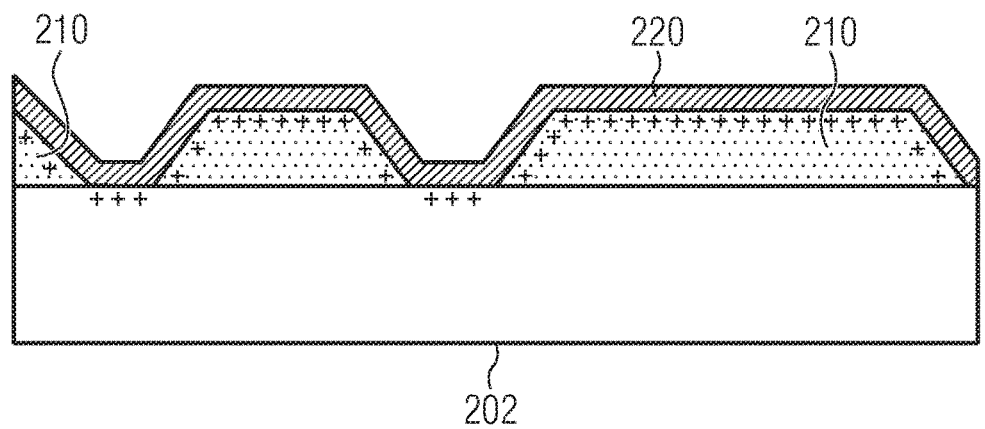
Figure 2E:
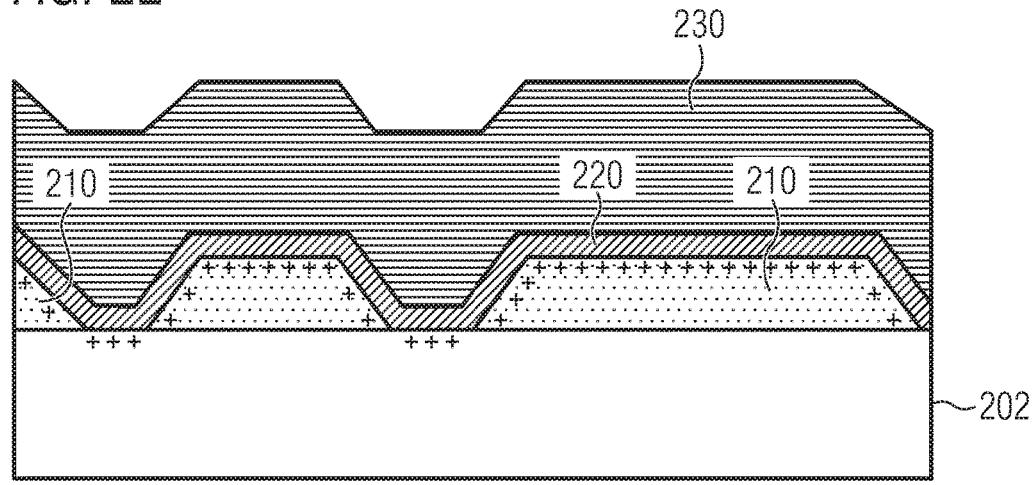
Figure 2F:
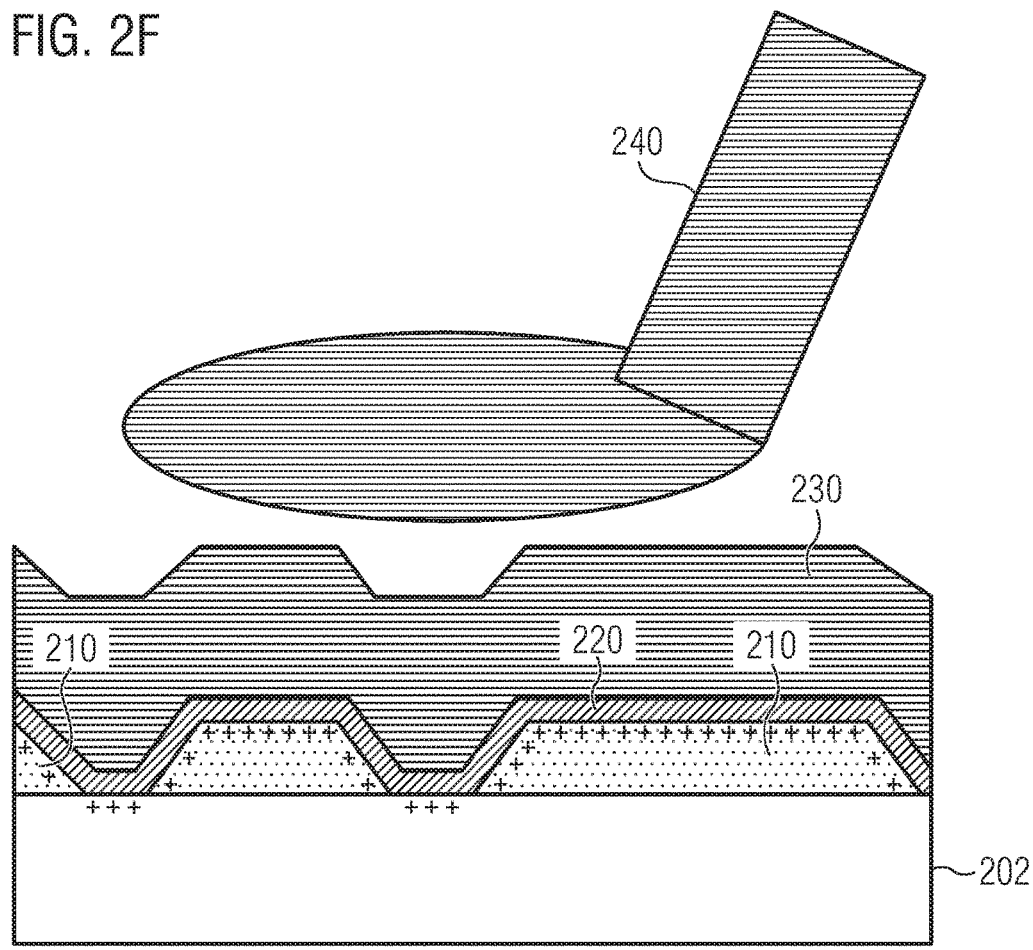

Afterwards, a barrier layer 220 is deposited (e.g. sputtered or grown) on the surface of the insulating material layer 210 as shown in FIG. 2d. Then, a metal layer 230 is deposited on the barrier layer 220 as shown in FIG. 2e. Afterwards, a wire 240 is bonded onto the metal layer 230 as shown in FIG. 2f.

More details and aspects are mentioned in connection with the embodiments described above or below. The embodiment shown in FIGS. 2a-2f may comprise one or more optional additional features corresponding to one or more aspects mentioned in connection with the proposed concept or one or more embodiments described above (e.g. FIG. 1) or below (e.g. FIG. 4-5).

Figure 3:
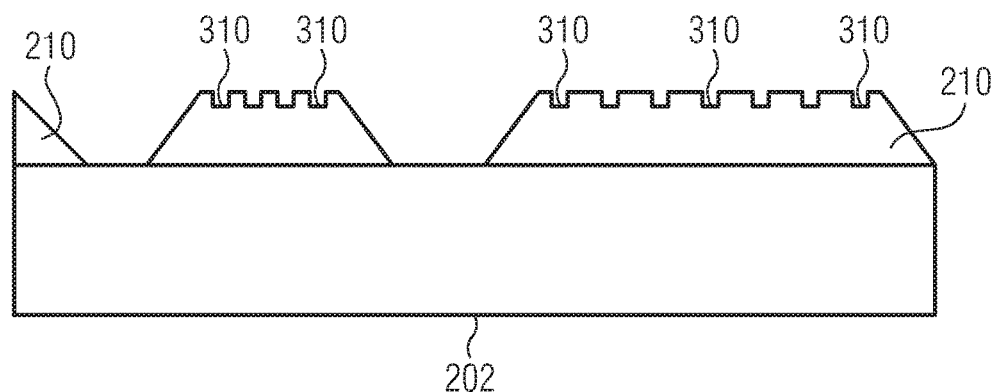
FIG. 3 shows a schematic cross section of a semiconductor device during manufacturing.

FIG. 3 shows a schematic cross section of a semiconductor device during manufacturing according to an embodiment. The implementation of the method for forming the semiconductor device is similar to the method described in connection with FIGS. 2a-2f. However, the surface of the insulating material layer 210 is modified by forming a plurality of trenches into the surface of the insulating material layer 210 (as shown in FIG. 3) instead of irradiating the surface of the insulating material layer 210 with ions (as shown in FIG. 2b).

More details and aspects are mentioned in connection with the embodiments described above or below. The embodiment shown in FIG. 3 may comprise one or more optional additional features corresponding to one or more aspects mentioned in connection with the proposed concept or one or more embodiments described above (e.g. FIG. 1-2) or below (e.g. FIG. 4-5).

Figure 4:
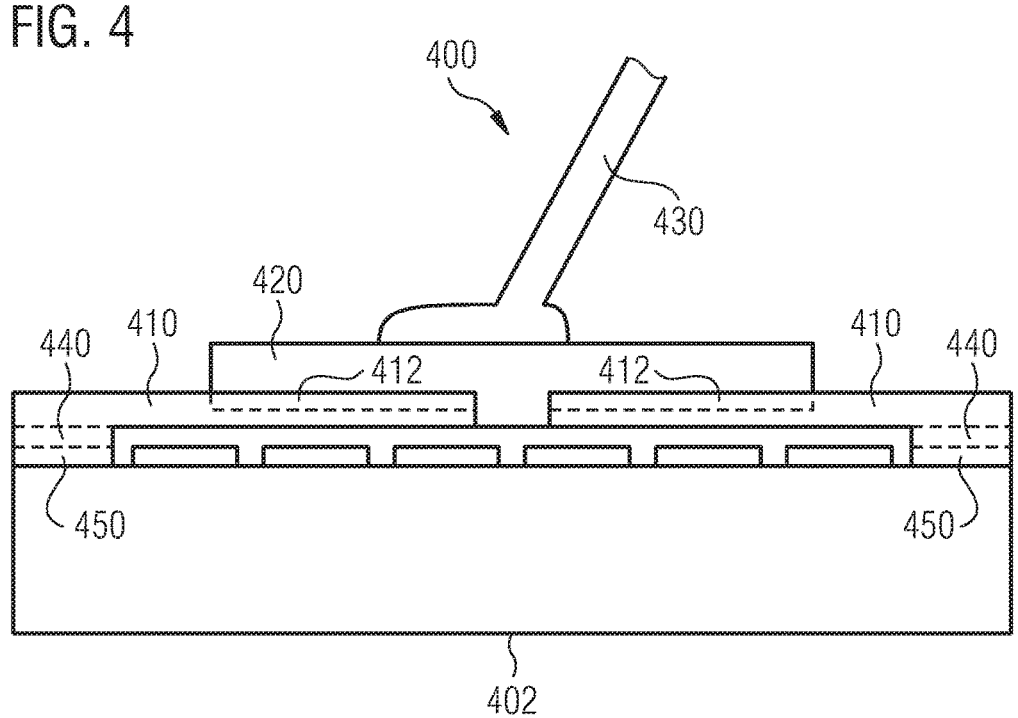
FIG. 4 shows a schematic cross section of a semiconductor device.

FIG. 4 shows a schematic cross section of a semiconductor device according to an embodiment. The semiconductor device 400 comprises an insulating material layer 410 located above a semiconductor substrate 402. The insulating material layer 410 comprises at least one contact hole. Further, the semiconductor device 400 comprises a modified portion 412 of the insulating material layer 410 extending laterally from the contact hole to a lateral distance from the contact hole of more than 300 nm (or more than 500 nm, more than 1 µm, more than 5 µm, more than 10 µm, more than 20 µm or more than 50 µm) and vertically from the surface of the insulating material layer 410 to a depth of more than 10 nm (or more than 50, more than 100, more than 200 nm or more than 500 nm). The modified portion 412 comprises a (e.g., average or maximal) concentration of noble gas atoms of more than $1*10^{15}$ cm$^{-3}$ (or more than $1*10^{13}$ cm$^{-2}$ or more than $1*10^{14}$ cm$^{-2}$). Additionally, the semiconductor device 400 comprises an electrical conductive structure 420 arranged adjacent to the modified portion 412 of the insulating material layer 410 and a wire 430 bonded onto the electrical conductive structure 420.

By implanting a surface portion of the insulating material layer with noble gas ions, the adhesion or adhesive strength between the insulating material layer and the electrical conductive structure may be increased. A resulting increased concentration of noble gas atoms may remain in the modified portions of the insulating material layer. For example, the risk of a lift off of the electrical conductive structure from the insulating material layer during bonding and/or during load cycling may be reduced. In this way, the reliability and/or the load cycling capability of semiconductor devices and/or the manufacturing yield may be increased.

For example, the at least one modified portion 412 of the insulating material layer 410 may extend laterally from the at least one contact hole to a distance from the contact hole of more than 300nm and/or may extend laterally at least over a surface area of the insulating material layer 410 covered by the electrical conductive structure 420.

Alternatively or additionally, the modified portion 412 of the insulating material layer 410 may comprise a plurality of trenches extending vertically into the insulating material layer instead of or additional to comprising noble gas atoms at the concentration of more than $1*10^{15}$ cm$^{-3}$.

The layer stack of the semiconductor device 400 located on the semiconductor substrate 402 may comprise the insulating material layer 410 and the electrical conductive structure 420 only (e.g. FIG. 5) or may comprise one or more additional lateral wiring layers 440 (e.g. lateral electrical conductive wiring structures embedded in insulating material) and/or one or more vertical wiring layers 450 (e.g. insulating material layer with contact holes for vias) as shown in FIG. 4.

Further, the insulating material layer 410 may comprise a plurality of contact holes filled by the electrical conductive structure 420. For example, the electrical conductive structure 420 and the wire may comprise mainly copper (e.g. more than 50% copper).

For example, at least one electrical element (e.g. transistor or diode) may be formed at the semiconductor substrate. The electrical element may be a lateral electrical element (e.g. a metal-oxide-semiconductor field effect transistor with contacts to the source and drain doping region at the front side of the semiconductor substrate) or a vertical electrical element arrangement (e.g. transistor with a contact to the source doping region, the drain doping region, the collector doping region or the emitter doping region at a back side of the semiconductor substrate). A vertical electrical element arrangement may be an electrical structure enabling a vertical current flow through the semiconductor substrate 102 in a conductive state of the vertical electrical element arrangement. The vertical electrical element arrangement may be a vertical diode arrangement or a vertical transistor arrangement (e.g. a metal-oxide-semiconductor field effect transistor or insulated-gate-bipolar transistor). For example, the electrical conductive structure 420 may form a source pad connected to one or more source regions of a field effect transistor or insulated-gate-bipolar transistor.

For example, the semiconductor device may be processor device, a sensor device or a power semiconductor device. A power semiconductor device or an electrical structure (e.g. transistor structure or diode structure) of the power semiconductor device may have a breakdown voltage or blocking voltage of more than 10V (e.g. a breakdown voltage of 10 V, 20 V or 50V), more than 100 V (e.g. a breakdown voltage of 200 V, 300 V, 400V or 500V) or more than 500 V (e.g. a breakdown voltage of 600 V, 700 V, 800V or 1000V) or more than 1000 V (e.g. a breakdown voltage of 1200 V, 1500 V, 1700V, 2000V, 3300V or 6500V), for example.

More details and aspects are mentioned in connection with the embodiments described above or below. The embodiment shown in FIG. 4 may comprise one or more optional additional features corresponding to one or more aspects mentioned in connection with the proposed concept or one or more embodiments described above (e.g. FIG. 1-3) or below (e.g. FIG. 5).

Figure 5:
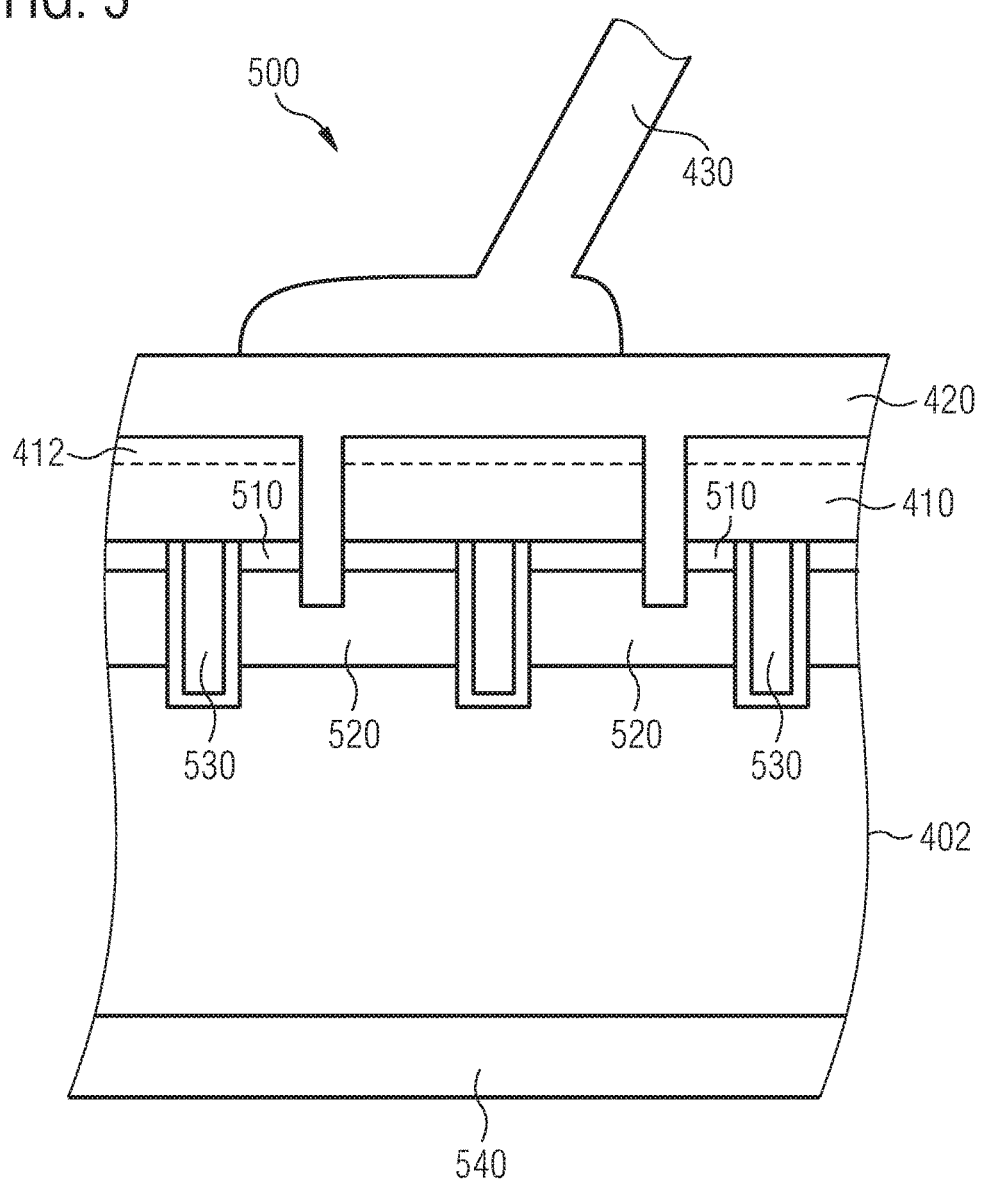
FIG. 5 shows a schematic cross section of another semiconductor device.

FIG. 5 shows a schematic cross section of a part of a semiconductor device according to an embodiment. The implementation of the semiconductor device 500 is similar to the implementation describe in connection with FIG. 4. However, the insulating material layer 410 is formed directly on the semiconductor substrate 402 and comprises a plurality of vertical contact holes filled by the electrical conductive structure 420. Further, the semiconductor device 500 comprises a vertical field effect transistor arrangement comprising a plurality of source doping regions 510 and a plurality of body doping regions 520 located adjacent to a plurality of gate trenches containing gate electrodes 530. A drift doping region of the vertical field effect transistor arrangement is located vertically between the body regions 520 and a drain doping region 540 located at a backside of the semiconductor substrate 402. The electrical conductive structure 420 is electrically connected to source doping regions 510 and body doping regions 520 of the vertical field effect transistor arrangement.

More details and aspects are mentioned in connection with the embodiments described above or below. The embodiment shown in FIG. 5 may comprise one or more optional additional features corresponding to one or more aspects mentioned in connection with the proposed concept or one or more embodiments described above (e.g. FIG. 1-4).

Some embodiments relate to an improvement of the ability of bonding by implantation.

To achieve better load cycling capabilities and/or to achieve the required load cycling capabilities at higher current densities in the chip, mechanically more stable Cu wires can be used instead of Al wires. The change-over from 400 µm Al bond wires to 400 µm Cu bond wires in wedge bonding may result in significantly increased demands concerning the chip metallization. This may be attributable to the considerably higher hardness of Cu compared to Al, which may be required a chip metallization which may also be noticeably harder than the aluminum metallization used. For example, the chip metallization may be also performed in Cu. However, despite the use of various metals as an interface to the oxide base (BPSG), this may result in a significantly poorer bond yield when Cu wires were used compared to the use of Al wires, as the harder bond wires may require significantly higher forces to connect to the chip metallization. The boundary between the oxide and the first (lowest) metallization layer may be the weakest interface.

By introducing a damage implantation into the oxide, it may be possible to perceptibly improve the adhesion between the two layers and therefore the bond yield so that, the yield may be equivalent to the one of Al bond wires.

In other words, using a damage implantation into the oxide may result in a better adhesion of the metallization to the oxide. Thus, the bond yield increases considerably. The costs involved may be low.

Using the damage implantation may improve the adhesion of the barrier metallization located below the Cu to oxide, leading to a perceptibly improved bond yield. For example, the damage in the Si crystal may be kept low, although the via holes already opened at this time so that the contact resistances might not adversely affected.

Damage-I2 (implantation) comprising non-doping elements, e.g., Ar in a range of $1E13-9E14$ $cm^{-2}$ and 20-80 keV, may result in a significantly improved bond yield. Higher implantation doses ($>5E14$ $cm^{-2}$) might not result in an (further) improved bond yield, but may result in a considerable deterioration of the contact resistances by Si crystal amorphization. The damage implantation may be performed using Ar at 80 keV and a dose of 1E14..In terms of cleaning, only non-over-etching cleans (e.g. water flush or alcohol flush) may be carried out between the damage implantation and the first metallization (of the electrical conductive structure). In addition to Ar, similar improvements in adhesion may be obtained using other elements, e.g., Kr, Xe, or also doping elements, e.g., As.

Alternatively or additionally, design modifications, which increase the oxide surface (e.g. by etch trenches) may increase the adhesion and may lead to an increase of the bond yield.

Example embodiments may further provide a computer program having a program code for performing one of the above methods, when the computer program is executed on a computer or processor. A person of skill in the art would readily recognize that acts of various above-described methods may be performed by programmed computers. Herein, some example embodiments are also intended to cover program storage devices, e.g., digital data storage media, which are machine or computer readable and encode machine-executable or computer-executable programs of instructions, wherein the instructions perform some or all of the acts of the above-described methods. The program storage devices may be, e.g., digital memories, magnetic storage media such as magnetic disks and magnetic tapes, hard drives, or optically readable digital data storage media. Further example embodiments are also intended to cover computers programmed to perform the acts of the above-described methods or (field) programmable logic arrays ((F)PLAs) or (field) programmable gate arrays ((F)PGAs), programmed to perform the acts of the above-described methods.

The description and drawings merely illustrate the principles of the disclosure. It will thus be appreciated that those skilled in the art will be able to devise various arrangements that, although not explicitly described or shown herein, embody the principles of the disclosure and are included within its spirit and scope. Furthermore, all examples recited herein are principally intended expressly to be only for pedagogical purposes to aid the reader in understanding the principles of the disclosure and the concepts contributed by the inventor(s) to furthering the art, and are to be construed as being without limitation to such specifically recited examples and conditions. Moreover, all statements herein reciting principles, aspects, and embodiments of the disclosure, as well as specific examples thereof, are intended to encompass equivalents thereof.

It should be appreciated by those skilled in the art that any block diagrams herein represent conceptual views of illustrative circuitry embodying the principles of the disclosure. Similarly, it will be appreciated that any flow charts, flow diagrams, state transition diagrams, pseudo code, and the like represent various processes which may be substantially represented in computer readable medium and so executed by a computer or processor, whether or not such computer or processor is explicitly shown.

Furthermore, the following claims are hereby incorporated into the Detailed Description, where each claim may stand on its own as a separate embodiment. While each claim may stand on its own as a separate embodiment, it is to be noted that—although a dependent claim may refer in the claims to a specific combination with one or more other claims—other embodiments may also include a combination of the dependent claim with the subject matter of each other dependent or independent claim. Such combinations are proposed herein unless it is stated that a specific combination is not intended. Furthermore, it is intended to include also features of a claim to any other independent claim even if this claim is not directly made dependent to the independent claim.

It is further to be noted that methods disclosed in the specification or in the claims may be implemented by a device having means for performing each of the respective acts of these methods.

Further, it is to be understood that the disclosure of multiple acts or functions disclosed in the specification or claims may not be construed as to be within the specific order. Therefore, the disclosure of multiple acts or functions will not limit these to a particular order unless such acts or functions are not interchangeable for technical reasons.

Furthermore, in some embodiments a single act may include or may be broken into multiple sub acts. Such sub acts may he included and part of the disclosure of this single act unless explicitly excluded.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for forming a semiconductor device, the method comprising:
    forming an insulating material layer above a semiconductor substrate;
    modifying at least a portion of a surface of the insulating material layer after forming the insulating material layer; and
    forming an electrical conductive structure on at least a modified portion of the surface of the insulating material layer after modifying at least the portion of the surface of the insulating material layer,
    wherein the insulating material layer comprises a contact hole through which the electrical conductive structure is electrically connected to at least one electrical element formed in the semiconductor substrate,
    wherein modifying at least the portion of the surface of the insulating material layer comprises irradiating at least the portion of the surface of the insulating material layer with ions.

2. The method of claim 1, wherein the ions are noble gas ions, dopant ions, oxygen ions or silicon ions.

3. The method of claim 1, wherein at least the portion of the surface of the insulating material layer is irradiated by ions at an energy of more than 1 keV and less than 200 keV.

4. The method of claim 1, wherein at least the portion of the surface of the insulating material layer is irradiated with an ion dose of more than $1*10^{12}$ cm$^{-2}$.

5. The method of claim 1, wherein modifying at least the portion of the surface of the insulating material layer comprises forming a plurality of trenches in the insulating material layer.

6. The method of claim 5, wherein the trenches have a width of more than 30 nm and less than 5 µm.

7. The method of claim 5, wherein the trenches have a depth of more than 5 nm and less than 2 µm.

8. The method of claim 1, further comprising bonding a wire on the electrical conductive structure.

9. The method of claim 1, wherein forming the electrical conductive structure comprises forming a metal layer or a barrier layer directly on at least the modified portion of the surface of the insulating material layer.

10. The method of claim 9, wherein the barrier layer comprises at least one of titanium, tungsten, titanium tungsten, tantalum, tantalum nitride, titanium nitride, titanium tungsten nitride, chromium, titanium silicide, tantalum silicide and nickel silicide.

11. The method of claim 9, wherein forming the electrical conductive structure comprises forming the metal layer on the barrier layer.

12. The method of claim 9, wherein the metal layer comprises at least one of aluminum, copper, aluminum silicide, aluminum silicon copper, nickel, nickel phosphorous, nickel molybdenum phosphorous, palladium, gold and silver.

13. The method of claim 9, wherein the metal layer has a thickness of more than 400 nm and less than 80 µm.

14. The method of claim 1, wherein the insulating material layer is at least one of a silicon oxide based layer, a silicon nitride based layer and an aluminum oxide based layer.

15. The method of claim 1, wherein the insulating material layer has a thickness of more than 100 nm.

16. The method of claim 1, wherein at least the modified portion of the surface of the insulating material layer extends laterally from the contact hole to a distance from the contact hole of more than 300 nm.

* * * * *